United States Patent [19]
Ohsaki et al.

[11] Patent Number: 5,565,708
[45] Date of Patent: Oct. 15, 1996

[54] SEMICONDUCTOR DEVICE COMPRISING COMPOSITE BARRIER LAYER

[75] Inventors: Akihiko Ohsaki; Sumio Yamaguchi; Atsushi Ishii; Kazuyoshi Maekawa; Masahiko Fujisawa, all of Hyogo, Japan

[73] Assignee: Mitsubishi Denki Kabushiki Kaisha, Tokyo, Japan

[21] Appl. No.: 440,808

[22] Filed: May 15, 1995

[30] Foreign Application Priority Data

Oct. 6, 1994 [JP] Japan .................. 6-242981

[51] Int. Cl.⁶ .......... H01L 23/48; H01L 29/46; H01L 29/62; H01L 29/54
[52] U.S. Cl. .......... 257/764; 257/754; 257/751; 257/763; 257/915; 257/770; 257/767; 257/740
[58] Field of Search .......... 257/764, 754, 257/751, 763, 764, 765, 915, 740, 767, 770

[56] References Cited

U.S. PATENT DOCUMENTS

| | | | |
|---|---|---|---|
| 4,926,237 | 5/1990 | Sun et al. | 257/767 |
| 4,985,750 | 1/1991 | Hoshino | 257/761 |
| 5,049,975 | 9/1991 | Ajika et al. | 257/764 |
| 5,202,579 | 4/1993 | Fujii et al. | 257/915 |
| 5,242,860 | 9/1993 | Nulman et al. | 437/190 |
| 5,360,996 | 11/1994 | Nulman et al. | 257/767 |
| 5,381,040 | 1/1995 | Sun et al. | 257/754 |
| 5,414,301 | 5/1995 | Thomas | 257/751 |
| 5,430,328 | 7/1995 | Hsue | 257/754 |

FOREIGN PATENT DOCUMENTS

| | | |
|---|---|---|
| 3-154332 | 7/1991 | Japan . |
| 4-243181 | 8/1992 | Japan . |
| 5-160070 | 6/1993 | Japan . |
| 5-326426 | 12/1993 | Japan . |
| 6-53148 | 2/1994 | Japan . |
| 6-65731 | 3/1994 | Japan . |
| 0204170 | 7/1994 | Japan . |

*Primary Examiner*—Robert P. Limanek
*Assistant Examiner*—Alexander Oscar Williams
*Attorney, Agent, or Firm*—Lowe, Price, LeBlanc & Becker

[57] ABSTRACT

A semiconductor device comprising conductors electrically connected through a contact hole interlayer insulation layer with a trilayer barrier layer comprising a titanium silicide layer, titanium silicide layer formed on the titanium silicide by collimation sputtering, and a thermally nitrided titanium formed on the titanium nitride layer. The use of a trilayer barrier layer enables through the capacity of the collimation sputtering apparatus to be increased, prevents particles from occurring, and formation of a low resistance electrical connection between conductors, in addition to preventing diffusion from the titanium nitride layer and the second titanium layer to the thermally nitrided titanium layer, and between conductors.

13 Claims, 10 Drawing Sheets

SEMICONDUCTOR DEVICE COMPRISING COMPOSITE BARRIER LAYER

TECHNICAL FIELD

This invention relates to a semiconductor device comprising an electrical interconnection between two conductors via a contact hole formed in an interlayer insulation layer, and to its manufacturing method. The invention has particular utility in submicron devices comprising contact holes having a high aspect ratio.

BACKGROUND ART

Increasing demands for densification and performance of semiconductor devices require increasing miniaturization of semiconductor devices with submicron circuitry. Conventionally, semiconductor devices with submicron circuitry are fabricated by methods which comprise forming a contact hole in an interlayer insulation layer and filling the contact hole with an electrically conductive material for electrically connecting conductors at different levels, such as impurity diffusion regions formed at the surface of a semiconductor substrate, for example, source and drain regions of MOS transistors, with interconnection layers, and lower and upper interconnection layers with each other. The contact hole is filled with a conductive material, such as a metal, e.g., tungsten, formed as a buried plug in the contact hole. These metal plugs electrically connect an impurity diffusion region formed at the surface of the semiconductor substrate and an interconnection layer, or upper and lower interconnections. However, increasing miniaturization requires contact holes with increasingly high aspect ratios. As employed throughout the present disclosure, including the specification and claims, the expression "aspect ratio" denotes the ratio of the height of a contact hole to the opening diameter of the contact hole.

A method of manufacturing a semiconductor device comprising a contact hole filled with a metal plug to electrically connect an impurity diffusion region formed at the surface of a semiconductor substrate with an interconnection layer is described with respect to FIGS. 11 to 15. As shown in FIG. 11, an interlayer insulation layer 53 is formed on the surface of a semiconductor substrate 51 made of silicon formed with an impurity diffusion region 52 a portion of which forms contact region 52a. A contact hole 54 is formed in the interlayer insulation layer 53 above and exposing contact region 52a.

As shown in FIG. 12, sputtering is conducted in an argon gas atmosphere, employing a sputtering device equipped with a titanium target to form a titanium layer 55 on the entire surface of the semiconductor substrate 51, i.e., on the surface of the interlayer insulation layer 53 and on the contact region 52a located within a contact hole 54 in the interlayer insulation layer 53. A titanium nitride layer 56 is then formed on the entire surface of the semiconductor substrate 51, i.e., titanium layer 55, by reaction sputtering, employing a sputtering device equipped with a titanium target in a nitriding atmosphere, such as nitrogen or a mixture of nitrogen and argon.

As shown in FIG. 13, heat-treatment is conducted to convert the portion of titanium layer 55 in contact with contact region 52a into titanium silicide layer 57, which encroaches into impurity diffusion region 52. The bilayer structure thus fabricated, composed of titanium silicide layer 57 and titanium nitride layer 56, forms a barrier metal layer.

As shown in FIG. 14, tungsten layer 58 is then formed by a blanket chemical vapor deposition (CVD) method, as by depositing $WF_6$ gas on the entire surface of the semiconductor substrate 51, i.e., titanium nitride layer 56. Tungsten layer 58 is then etched back to leave a portion of tungsten layer 58 only in the contact region 52a, thereby forming a tungsten plug 59 as shown in FIG. 15. As also shown in FIG. 15, an aluminum layer is then formed on the entire surface of the semiconductor substrate 51, i.e., on the entire exposed surface of titanium nitride layer 56 and the surface of tungsten plug 59. The aluminum layer is etched employing conventional photolithographic techniques, thereby forming an interconnection portion 60.

Titanium layer 55 and titanium nitride layer 56 situated under the aluminum layer are also etched and removed, except for a portion or portions located below interconnection 60. The formed interconnection layer comprises interconnection portion 60 and tungsten plug 59. Impurity diffusion region 52 formed on the surface of semiconductor substrate 51, and interconnection layer comprising interconnection portion 60 and tungsten plug 59 are thus electrically connected to each other through the barrier metal layer 62 comprising titanium silicide layer 57 and titanium nitride layer 56.

In the above-described semiconductor device, since titanium is active, titanium layer 55 reduces the natural oxide film existing on the contact region 52a and forms titanium silicide layer 57 by reaction with silicon in the impurity diffusion region 52 during heat-treatment of the titanium layer 55, thereby forming a low resistance electrical connection between the impurity diffusion region 52 and the interconnection layer. Upon forming tungsten plug 59 directly on the surface of the titanium layer 55, peeling-off may occur. In addition, formation of tungsten layer 58 may be difficult due to reaction between $WF_6$ gas employed as a source gas for forming tungsten layer 58 and titanium layer 55. Accordingly, titanium nitride layer 56 functions as an adhesive layer between titanium layer 55 and tungsten 58.

Titanium nitride layer 56 also prevents the occurrence of warm holes at impurity diffusion region 52 when tungsten layer 58 is formed by blanket CVD employing $WF_6$ gas. A warm hole is a generally beard-shaped area of tungsten extending from the surface of the impurity diffusion region 52 to within semiconductor substrate 51, produced by reaction of $WF_6$ gas and silicon in the impurity diffusion region 52. The warm hole, if extending to the boundary between the impurity diffusion region 52 and the semiconductor substrate 51, or around a face of a PN junction, induces junction defects.

Upon fabricating a semiconductor device in the manner previously discussed with respect to FIGS. 11 through 15, and upon various examinations and extensive experimentation, we discovered several problems. Upon scaling down semiconductor devices fabricated in the above-discussed conventional manner, the aspect ratio of contact hole 54 of the interlayer insulation layer 53 was made increasingly higher to increase miniaturization. We found, however, that when the aspect ratio was made 2.5 or higher, (which is 0.6 μm or below in diameter of contact hole 54), the thickness of the film coverage at the bottom of the contact hole 54 shown in FIG. 12, i.e., the thickness of titanium film 55 and titanium nitride film 56 formed on contact region 52a of impurity diffusion region 52, become very thin, rendering it difficult to form a low resistance connection between tungsten plug 59 shown in FIG. 15 of the interconnection layer and impurity diffusion region 52, so that warm holes occurred as shown by reference numeral 11 in FIGS. 14 and 15. As the thickness of titanium film 55 and titanium nitride film 56 formed at the bottom of contact hole 54 shown in FIG. 12 becomes very thin, bottom coverage (the ratio of the thickness of a film located at the bottom of the contact hole 54 to the thickness of the film located at a flat portion) decreases as the aspect ratio of the contact hole 54 increases, as shown by a dotted line A in FIG. 17. If the aspect ratio of contact hole 54 is 2.5, the bottom coverage becomes 0.05 (5%) or below.

Specifically, where the aspect ratio is 3, in which the diameter and depth of contact hole 54 shown in FIG. 12 are 0.5 µm and 1.5 µm, respectively, and where titanium layer 55 and titanium nitride layer 56 have a thickness of about 200 Å and about 1,000 Å, respectively, on the surface of the interlayer insulation layer 53 (flat portion), the thicknesses of titanium layer 55 and titanium nitride layer 56 formed at the bottom of contact hole 54 were very thin, i.e., about 4 Å and about 20 Å, respectively, the bottom coverage was about 2%, rendering it difficult to form a low resistance connection between tungsten plug 59 of the interconnection layer and the impurity diffusion region 52, resulting in the occurrence of warm holes 11 as shown in FIGS. 14 and 15.

A prior approach for improving bottom coverage during formation of titanium layer 55 and titanium nitride layer 56 comprises a collimation sputtering technique. See, for example, Proc. VMIC Conference, p.p. 253 to 259 "COLLIMATED SPUTTERING OF TiN/Ti LINES INTO SUB-HALF MICRON HIGH ASPECT RATIO CONTACT/ LINES". We manufactured various semiconductor devices employing a collimation sputtering device as shown in FIG. 16, and conducted extensive examinations of the resulting semiconductor devices.

As shown in FIG. 16, the inside of an apparatus body 100 is filled with an argon atmosphere when titanium layer 55, described in FIG. 12, is to be formed, and with a mixture of nitrogen and argon when titanium nitride layer 56, described similarly in FIG. 12, is to be formed. A heat stage 101 is attached at the inside of the apparatus body, and a wafer 102 for forming plural semiconductor devices is positioned on top of heat stage 101. A wafer clamp 103 is employed to fix wafer 102 onto heat stage 101. A titanium target 104 is provided over heat stage 101 inside the apparatus body 100. A collimator 105, typically in the form of a plate with plural honeycomb holes, is positioned between heat stage 101 and titanium target 104. A seal 106 is provided inside apparatus body 100 surrounding part of heat stage 101, wafer clamp 103, the titanium target 104, and collimator 105.

In employing the collimation sputtering apparatus described above with respect to FIG. 16 to form titanium layer 55, wafer 102, containing semiconductor devices completed up to the state shown in FIG. 11, is positioned on the surface of heat stage 101 and fixed thereto by wafer clamp 103. Wafer 102 is then heated by the heat stage 101. Meanwhile, argon gas is introduced into the apparatus body 100 to provide an argon gas atmosphere. Power is then supplied to titanium target 104 and sputtering particles of titanium are discharged from titanium target 104 and impinge on wafer 102, after removal of a large amount of oblique components by the collimator 105, thereby forming titanium layer 55 on the surface of interlayer insulation layer 53, on contact region 52a of impurity diffusion region 52 over which contact hole 54 in the interlayer insulation layer 53 is located, and on the exposed surfaces of interlayer insulation layer 53 in contact hole 54.

To form titanium nitride layer 56 on titanium layer 55, the power for titanium target 104 is turned off, and nitrogen gas introduced inside apparatus body 100 together with argon gas, thereby filling the inside of apparatus body 100 with a mixture of argon and nitrogen gases. Power is then supplied to titanium target 104 whereby sputtering particles of titanium are discharged from the titanium target 104 and are converted to sputtering particles of titanium nitride by reaction with nitrogen in the gas mixture. The sputtering particles of titanium nitride impinge upon wafer 102 after removal of a large amount of oblique components by collimator 105, thereby forming titanium nitride layer 56 on the entire surface of titanium layer 55, as shown in FIG. 12.

After extensive investigation, we found that a relationship existed between the bottom coverage and the aspect ratio of the contact hole 54. Adverting to FIG. 17, solid line B indicates the bottom coverage versus aspect ratio of contact hole 54 where the aspect ratio of collimator 105 (ratio of height versus hole diameter formed at the collimator 105) is 0.5; solid line C indicates the bottom coverage versus aspect ratio of contact hole 54 where the aspect ratio of collimator 105 is 1.0; solid line D indicates the bottom coverage versus aspect ratio of contact hole 54 and where the aspect ratio of collimator 105 is 1.5; and solid line E indicates the bottom coverage versus aspect ratio of contact hole 54 where the aspect ratio of collimator 105 is 2.0.

As apparent from FIG. 17, formation of titanium layer 55 and titanium nitride layer 56 by collimation sputtering improves bottom coverage in comparison with sputtering without a collimator. For example, where the aspect ratio of the collimator 105 is 1.5 (diameter and height of the hole are 2 cm and 3 cm, respectively), the bottom coverage will be about four times better.

We have, however, observed that upon forming titanium layer 55 and titanium nitride layer 56 by collimation sputtering, certain problems arose. It was initially found that the film formation speed of titanium layer 55 and titanium nitride layer 56 was dramatically reduced in comparison with that obtained by sputtering without a collimator, with an attendant reduction in treatment capacity. For example, it was found that when employing a collimator 105 with an aspect ratio of 1.5 (diameter and height of the hole are 2 cm and 3 cm, respectively), the film formation speed was lowered by ¼ to ⅕. This reduction in film formation is due to the reduction in the amount of sputtered particles reaching wafer 102, because of the large amount of oblique components removed by collimator 105 from the sputtering particles discharged from titanium target 104.

Secondly, we also found that titanium nitride attached to the collimator 105 peeled off during formation of titanium layer 55 and titanium nitride layer 56, and fell onto wafer 102. Thus, the collimator becomes a source of particles 108. In practice, a single collimator 105 is employed to treat several hundred wafers, during which titanium and titanium nitride, having a thickness of tens of µm or more, becomes attached to the collimator. Since titanium nitride is chemically stable and stressed, its adhesive force is relatively weak and, hence, it is easily peeled off the collimator. Though the titanium has less stress and can function as an adhesive, it cannot prevent titanium nitride from peeling off because the sputtered amount of titanium is significantly less than the sputtered amount of titanium nitride. For example, for a collimator having an aspect ratio of 1.5 (diameter and height of the hole are 2 cm and 3 cm, respectively), particles 108 increased several times after tens of wafers were treated.

A third problem we encountered is a reduction in the vacuum efficiency as wafers 102 are treated, thereby increasing the time required for sputtering particles of titanium from titanium target 104. It is believed that this problem is caused by increasing amounts of titanium nitride attaching to the collimator 105 and by an attendant release of increasing amounts of nitrogen gas from the attached titanium nitride.

In an attempt to solve the second and third problems, a so-called cleaning period was established in which, as shown in FIG. 16, a shutter 109 was installed between collimator 105 and wafer 102, after titanium nitride layer 56 is formed, and shut while sputtering particles of titanium are discharged from the titanium target 104. Since active titanium functions as an adhesive, it prevents the attached titanium nitride from peeling off collimator 105, thereby avoiding the formation of particles 108. Moreover, titanium is attached so as to cover the attached titanium nitride on the collimator 105, thereby preventing outgassing of nitrogen from the attached titanium nitride. In addition, the attached titanium improves evacuation by absorbing nitrogen. Therefore, the second and third problems can be addressed as in the specific example represented in FIG. 18, wherein titanium layer 55 and titanium nitride layer 56, as shown in FIG. 12, are formed using a collimation sputtering apparatus with a shutter 109. Specifically, where the aspect ratio of the contact hole is 3, in which the diameter and depth of the contact hole 54 are 0.5 μm and 1.5 μm, respectively, a titanium layer 55 having thickness of about 200 Å and a titanium nitride layer 56 having thickness of about 700 Å are formed on the surface, or a flat portion, of interlayer insulation layer 53 employing collimator 105 having an aspect ratio of 1.5 (diameter and height of the hole are 2 cm and 3 cm, respectively).

As shown in FIG. 16, wafer 102 comprising a semiconductor device completed up to the state shown in FIG. 11, is mounted on the surface of heat stage 101 and secured thereto with wafer clamp 103. The wafer 102 is heated by heat stage 101 and the inside of apparatus body 100 is evacuated. At this stage, step S51 in FIG. 18 starts and argon gas is introduced into the apparatus body 100 to provide an argon gas atmosphere. At step S52, power is supplied to titanium target 104 while the shutter is open, or while no shutter exists between the titanium target 104 and the wafer 102. It should be noted that it takes about 15 seconds from the start of step S51 until the flow rate of the argon gas into the inside of the apparatus body 100 becomes stable, and that argon gas continues to be introduced while power is supplied to the titanium target 104 and titanium layer 56 is being formed.

Titanium target 104 discharges sputtering particles of titanium. After a large amount of oblique components are removed by the collimator 105, the discharged particles impinge on the wafer 102, thereby forming titanium layer 55 on the surface of interlayer insulation layer 53, on contact region 52a of the impurity diffusion region 52 at which contact hole 54 in interlayer insulation layer 53 is located, and on the exposed surface side of interlayer insulation layer 53 in contact hole 54. In about 30 seconds, titanium layer 55 having a thickness of about 200 Å is formed on the surface of interlayer insulation layer 53, or a flat portion, and having a thickness of about 30 Å is formed on contact region 52a of impurity diffusion region 52 at which contact hole 54 in interlayer insulation layer 53 is located, with a bottom coverage of about 15%.

Next, at step S53 in FIG. 18, the power for titanium target 104 is turned off and, at the same time, argon and nitrogen gases are introduced into apparatus body 100 to form an atmosphere comprising a mixture of argon and nitrogen gases. At step S54, the titanium target 104 is turned on. It should be noted that it takes about 15 seconds from the start of step S53 until flow rate of the nitrogen gas into the inside of the apparatus body 100 becomes stable, and that the argon gas and the nitrogen gas continue to be introduced while the titanium layer 56 is being formed where power is supplied to the titanium target 104.

The titanium target 104 then discharges sputtering particles of titanium, which are converted to sputtering particles of titanium nitride by reaction with nitrogen in the gas mixture. After a large amount of oblique components are removed by collimator 105, the sputtering titanium nitride particles impinge on wafer 102, thereby forming titanium nitride layer 56 on the entire surface of titanium layer 55, as shown in FIG. 12. In about 105 seconds, a titanium nitride layer 56 is formed having a thickness of about 700 Å on the surface of interlayer insulation layer 53, or a flat portion, and having a thickness of about 105 Å on contact region 52a of impurity diffusion region 52 at which contact hole 54 in interlayer insulation layer 53 is located, with a bottom coverage of about 15%.

Next, at step S55, shown in FIG. 18, titanium target 104 is turned off, and shutter 109 is closed, or the shutter 109 is placed between the titanium target 104 and the wafer 104. During this period, the introduction of nitrogen gas is stopped. It took about 15 seconds at step S55 to close the shutter. After shutter 109 is completely closed, at step S56 power is supplied to titanium target 104, thereby discharging sputtering particles of titanium from the titanium target 104. The discharged sputtering titanium particles impinge on and become attached to collimator 105, and to shutter 109 when passed through collimator 105. As a result, titanium functions as an adhesive which prevents the attached titanium nitride from peeling off collimator 105 and, further, attaches to and covers the titanium nitride attached to collimator 105. This cleaning period (step S56) for sputtering titanium, which functions as an adhesive, took about 30 seconds for titanium to cover the attached titanium nitride.

At step S57, shutter 109 is closed and the introduction of the argon gas stopped at the same time, expending about 10 seconds. At this point, the processes for forming titanium layer 56 and titanium nitride layer 56 concludes.

The sequence of manipulative steps depicted in FIG. 18 was conducted to form titanium layer 56 as shown in FIG. 15 on about 500 sheets of wafers 102. The titanium silicide layer 57 formed by heat-treatment was made to have a thickness of about 75 Å and enabled the formation of a low resistance electrical connection between impurity diffusion region 52 and the interconnection layer. The titanium nitride layer 56 prevented films from peeling off when tungsten plug 59 of the interconnection layer is formed, and functioned as an adhesive layer between titanium layer 55 and tungsten layer 58. Titanium nitride layer 56 had a thickness of about 105 Å on contact region 52a of impurity diffusion region 52 at which contact hole 54 in interlayer insulation layer 53 is located, and contributed to preventing the occurrence of warm holes 11 at impurity diffusion region 52 upon formation of tungsten layer 58 by a blanket CVD method using $WF_6$ gas.

We have found, however, that the above described method depicted in FIG. 18 suffers from certain disadvantages. Specifically, when forming titanium layer 55 and titanium nitride layer 56 using a collimation sputtering apparatus having shutter 109, as described above, no layer can be formed on the wafer during the cleaning period when titanium is sputtered from titanium target 104 while the shutter 109 is closed. Therefore, the capacity of such a collimation sputtering device is significantly reduced. In addition, the method consumes large amounts of titanium, because titanium is sputtered from titanium target 104 during the cleaning period. Moreover, the diameter of the collimator's hole is reduced since titanium is attached thereto even during the cleaning period, thereby increasing the aspect ratio of the collimator early in the process and, consequently, reducing the amount of sputtering particles impinging on wafer 102 early in the process. As a result, it is necessary to shorten the replacement cycle of the collimators. In summary, the collimation sputtering apparatus containing a shutter suffers from lowered capacity and increased costs.

DISCLOSURE OF THE INVENTION

An object of the present invention is a semiconductor device in which electric connection is effected at a low resistance between a contact region of a first conductor and a second conductor electrically connected to the contact region through a contact hole of an interlayer insulation layer.

Another object of the present invention is a semiconductor device wherein a first conductor is electrically connected to a second conductor without the occurrence of warm holes.

Yet another object of the invention is a method of manufacturing a semiconductor device comprising a barrier layer between a contact region of a first conductor and a second conductor electrically connected to the contact region through a contact hole of an interlayer insulation layer, in an efficient, economical manner.

Another object of the present invention is a method of manufacturing a semiconductor device comprising a barrier layer between a contact region of a first conductor and a second conductor electrically connected to the contact region through a contact hole of an interlayer insulation layer, without the occurrence of warm holes.

According to the present invention, the foregoing and other objects are achieved in part by a semiconductor device comprising: a first conductor having a contact region on its surface; an interlayer insulation layer formed on said first conductor with a contact hole located on said contact region of said first conductor; a barrier layer comprising: a titanium silicide layer formed on said contact region of said first conductor located within said contact hole of the interlayer insulation layer; a titanium nitride layer formed on said titanium silicide by collimation sputtering; and a thermally nitrided titanium layer formed on said titanium nitride layer; and a second conductor formed on a surface of said interlayer insulation layer and also electrically connected to said contact region of said first conductor through said barrier layer.

A further aspect of the present invention is a semiconductor device comprising: a first conductor having a contact region on its surface; an interlayer insulation layer comprising a top surface formed on said first conductor, said interlayer insulation layer having a contact hole formed in and exposing surfaces of said interlayer insulation layer, said contact hole located on said contact region of said first conductor and having an aspect ratio of at least 2.5; a multilayer composite formed on said contact region, on said top surface of said interlayer insulation layer, and on said exposed surfaces within said contact hole, said multilayer composite comprising: (a) a barrier layer comprising: a titanium silicide layer having a thickness of about 50 to about 200 Å formed on and in contact with the contact region of said first conductor located within the contact hole; a first titanium nitride layer having columnar grains formed on said titanium silicide layer; and a second titanium nitride layer having particulate grains formed on said first titanium nitride layer; wherein said titanium silicide layer has a thickness of about 50 to about 200 Å, and the total thickness of said first and second titanium nitride layers is about 60 to about 300 Å; and (b) an insulation contacting portion comprising: a titanium layer on said top surface of said interlayer insulation layer and on said exposed surfaces of said interlayer insulation layer in said contact hole above said barrier layer, said titanium layer having a thickness of about 150 to about 500 Å; a first titanium nitride layer having columnar grains formed on said titanium layer; and a second titanium nitride layer having particle grains formed on said first titanium nitride layer; wherein said first and second titanium nitride layers each has a thickness of at least about 100 Å and a total thickness of about 400 Å to about 1000 Å; and a second conductor formed on said barrier layer and electrically connected to the contact region of said first conductor through said barrier layer.

A further aspect of the present invention is an improved multilevel semiconductor device comprising a first conductor formed on a lower level separated by an interlayer insulating layer and a second conductor formed on an upper level, wherein the first conductor is electrically connected to the second conductor by an interconnection in a throughhole of the interlayer insulating layer, and wherein the interconnection comprises a barrier layer, the improvement wherein the barrier layer comprises: a titanium silicide layer formed on at least a portion of the first conductor; a first titanium nitride layer formed on said titanium silicide layer; and a thermally nitrided titanium layer formed on said first titanium nitride layer.

Another aspect of the present invention is a method of manufacturing a semiconductor device comprising: forming an interlayer insulation layer on a surface of a first conductor having a contact region, wherein said interlayer insulation layer has a top surface; forming a contact hole in the interlayer insulation layer exposing at least a portion of said contact region of said first conductor and exposing surfaces of said interlayer insulation layer; forming a first titanium layer by collimation sputtering on said exposed surfaces of said interlayer insulation layer and on the contact region of said first conductor located within the contact hole of said interlayer insulation layer; forming a titanium nitride layer on said first titanium layer by collimation sputtering; forming a second titanium layer on said titanium nitride layer by collimation sputtering; heat-treating in a nitriding atmosphere to convert the portion of said first titanium layer contacting the contact region of said first conductor into a titanium silicide layer, and to convert said second titanium layer into a thermally nitrided titanium layer; and forming on said thermally nitrided titanium layer a second conductor electrically connected to said thermal titanium nitride layer.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF DRAWINGS

In all figures, the same and the substantially same elements are identified with the same reference numerals.

DESCRIPTION OF THE INVENTION

The present invention addresses and solves problems attendant upon conventional practices of forming a barrier layer in a contact hole between two conductors, particularly those problems encountered with contact holes having a high aspect ratio, such as poor bottom coverage, slow film formation speed, peeling and particle formation, as previously mentioned. In accordance with the present invention, low electrical contact is formed between first and second conductors by a barrier layer comprising a titanium silicide layer, a titanium nitride layer and a thermal titanium nitride layer, formed by collimation sputtering in a short period of time, whereby the thickness on the contact region of the first conductor at which the contact hole in the interlayer insulation layer is increased thereby preventing the formation of particles and diffusion from the second conductor to the first conductor. In addition, the titanium silicide layer provides low resistance contact between the first and second conductors. The first titanium nitride layer has columnar grains, while the second titanium nitride layer has particulate grains, thereby preventing diffusion from the second conductor to the first conductor. No problem occurs if a small amount of nitrogen gas is introduced during the initial period of forming second titanium layer 13, subsequent to forming titanium nitride layer 6, because second titanium layer 13 is subsequently converted to a thermal titanium nitride layer.

Figure 1:
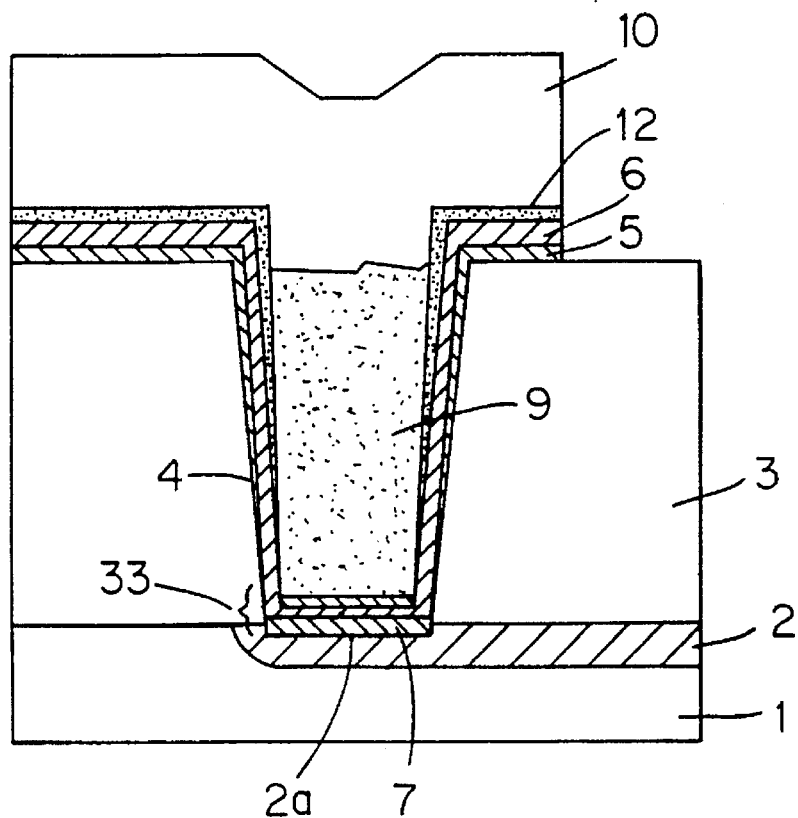
FIG. 1 is a cross-sectional view of an embodiment of the invention.

An embodiment of a semiconductor device according to the present invention is depicted in FIGS. 1 through 8. As shown in FIG. 1, semiconductor substrate 1, such as a p-type semiconductor substrate, is made of silicon, constitutes a first conductor. An impurity diffusion region 2 is formed at the surface of semiconductor substrate 1, a portion of which has a contact region 2a, such as an n-type source or drain region of an MOS transistor. An interlayer insulation layer 3 is formed on the surface of the semiconductor substrate 1, and then a contact hole 4 on contact region 2a of the semiconductor substrate 1 in a conventional manner employing conventional deposition, photolithographic and etching techniques. This embodiment involves a contact hole with a relatively high aspect ratio. Therefore, the aspect ratio of the contact hole 4 is 2.5 or more (which is 0.6 µm or below in diameter), for example, the aspect ratio is 3 (in which case the diameter and depth of the contact hole are 0.5 µm and 1.5 µm, respectively).

A first titanium layer 5 is formed on the surface of interlayer insulation layer 3 and on contact region 2a of semiconductor substrate 1 at which contact hole 4 in interlayer insulation layer 3 is located, and comprises a titanium silicide layer 7 at a contact portion thereof to contact region 2a of semiconductor substrate 1. The first titanium layer 5 has an appropriate thickness, such as about 200 Å on the surface, or on a flat portion, of interlayer insulation layer 3, while the film thickness of titanium silicide layer portion 7 can be about 75 Å.

Figure 2:
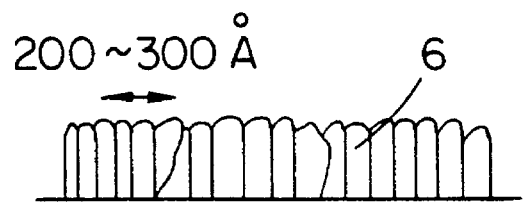
FIG. 2 is a partial cross-sectional view of titanium nitride layer 6 of the FIG. 1 embodiment.

A first titanium nitride layer 6 is formed by collimation sputtering on the surface of first titanium layer 5, including titanium silicide layer portion 7. First titanium nitride layer 6 is characterized by columnar grains having diameter of about 200 to about 300 Å as shown in FIG. 2. First titanium nitride layer 6 is formed in an appropriate thickness, for example, about 500 Å on the surface, or a flat portion, of interlayer insulation layer 3, and about 75 Å on contact region 2a of semiconductor substrate 1.

Figure 3:
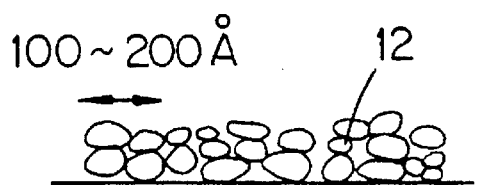
FIG. 3 is a partial cross-sectional view of a thermal titanium nitride layer 12 of the FIG. embodiment.

A thermal titanium nitride layer 12, as a second titanium nitride layer, is formed on the surface of first titanium nitride layer 6, and is characterized by particulate grains having a diameter of about 100 to about 200 Å as shown in FIG. 3. The second titanium nitride layer has an appropriate thickness, for example, about 200 Å on the surface, or a flat portion, of the interlayer insulation layer 3, and about 30 Å on contact region 2a of semiconductor substrate 1. Titanium layer 5, including titanium silicide layer portion 7, first titanium nitride layer 6, and second titanium nitride layer 12 constitute a barrier metal layer 33.

A buried portion 9 of a second conductor is buried in contact hole 4 of interlayer insulation layer 3, and is electrically connected to the barrier metal layer 33 which is electrically connected to impurity diffusion region 2 of semiconductor substrate 1. The buried portion 9 can comprise any conductive material conventionally employed in the semiconductor industry for forming electrically conductive regions, such as tungsten. The second conductor also comprises an interconnecting portion 10 electrically connected to buried portion 9 and is formed on barrier metal layer 33 and on interlayer insulation layer 3. Thus, the second conductor comprises buried portion 9 and interconnecting portion 10. The interconnecting portion can comprise any conductive material conventionally employed in the semiconductor industry for forming electrical conductive regions, such as aluminum or an aluminum alloy, for example, Al-0.5 wt %Cu or Al-1 wt %Si-0.5 wt %Cu.

Figure 4:
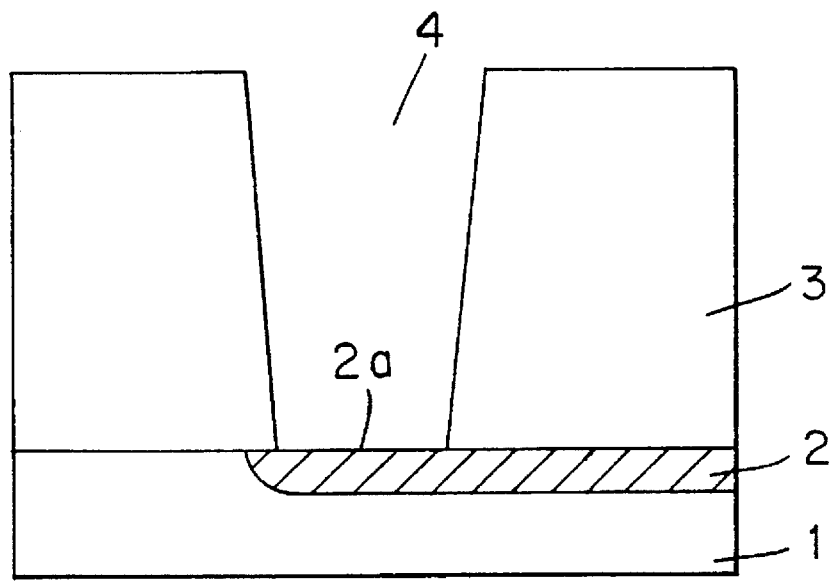
FIGS. 4 through 7 are cross-sectional views showing steps of a manufacturing method according to the invention.

A method of manufacturing a semiconductor device according to the FIG. 1 embodiment is shown in FIGS. 4 through 7, wherein similar elements bear like reference numerals. As shown in FIG. 4, interlayer insulation layer 3 is formed on the surface of semiconductor substrate 1 having impurity diffusion region 2, a surface portion of which serves as contact region 2a. Contact hole 4 is formed in interlayer insulation layer 3 to expose contact region 2a.

Figure 5:
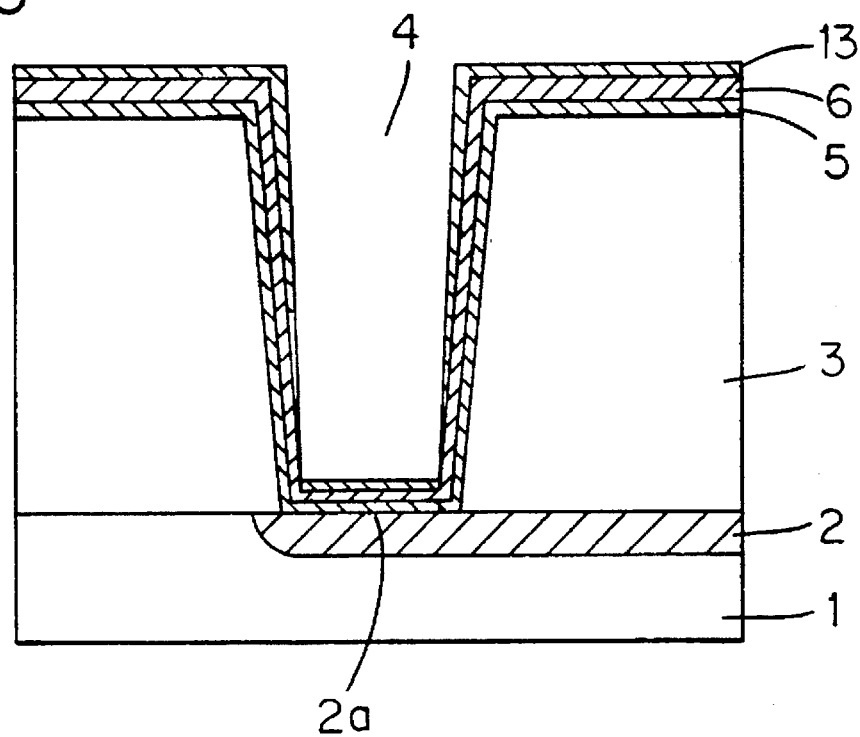

As shown in FIG. 5, employing a collimation sputtering apparatus equipped with a titanium target, there are successively formed: a first titanium layer 5 by sputtering titanium in an argon gas atmosphere on the surface of interlayer insulation layer 3 and on contact region 2a of the semiconductor substrate 1 at which contact hole 4 in interlayer insulation layer 3 is located; titanium nitride layer 6 by reactive sputtering titanium in a nitriding atmosphere, such as nitrogen or a gas mixture of nitrogen and argon, on first titanium layer 5; and second titanium layer 13 by sputtering titanium in an argon gas atmosphere on titanium nitride layer 6.

Figure 8:
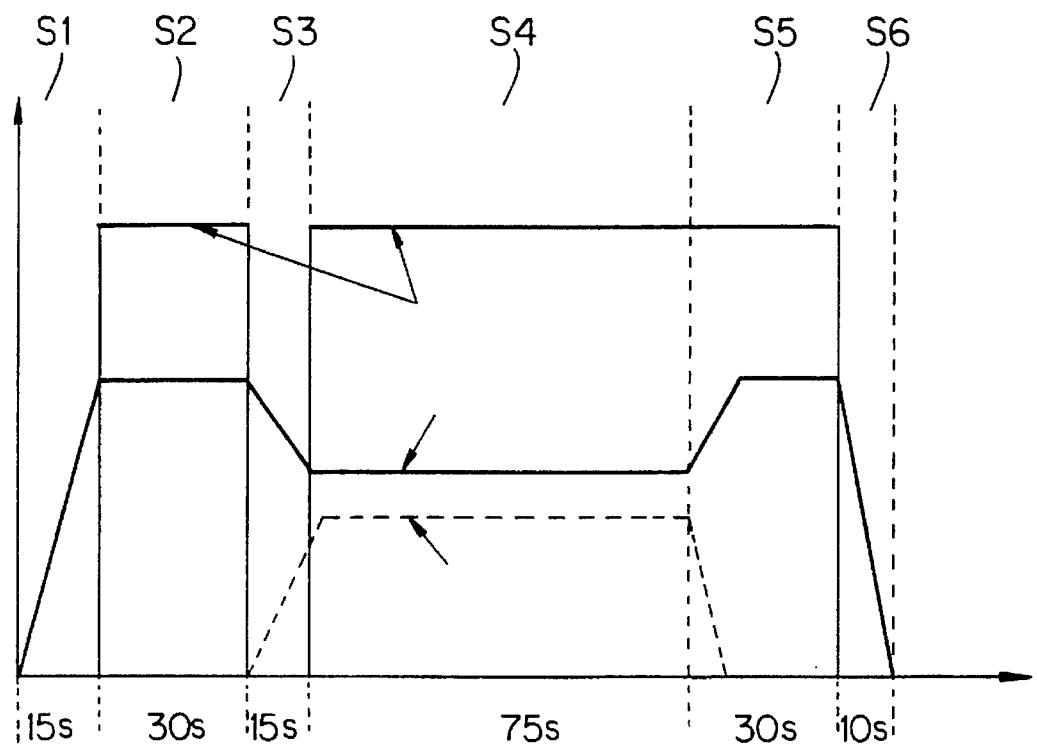
FIG. 8 is a flow diagram for manufacturing a barrier layer according to the invention.
Figure 16:
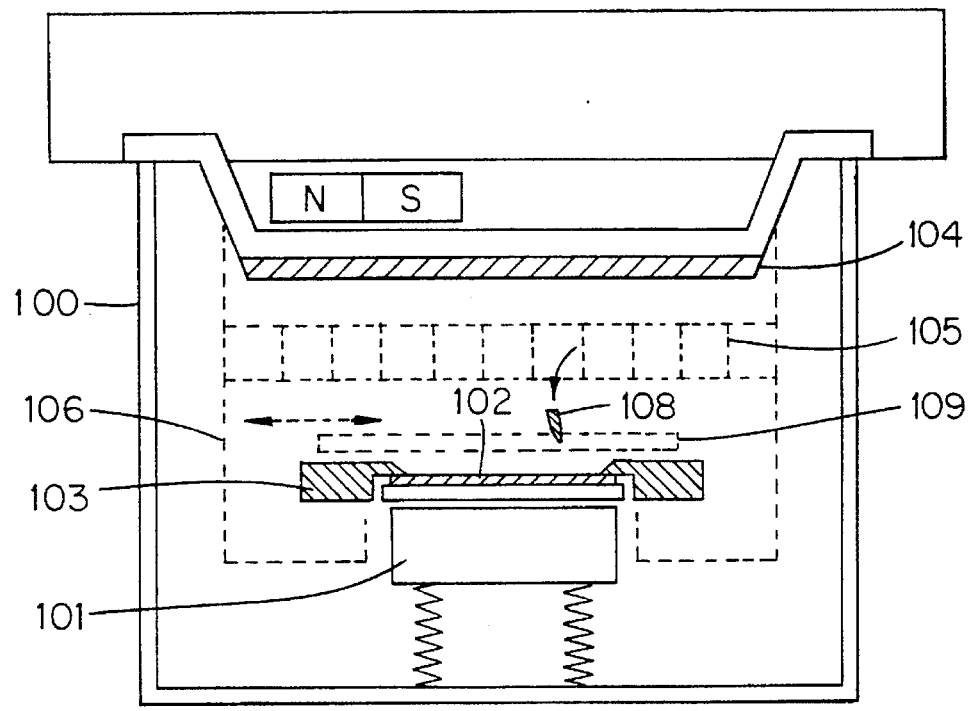
FIG. 16 is a schematic structure diagram of a collimation sputtering apparatus.
Figure 17:
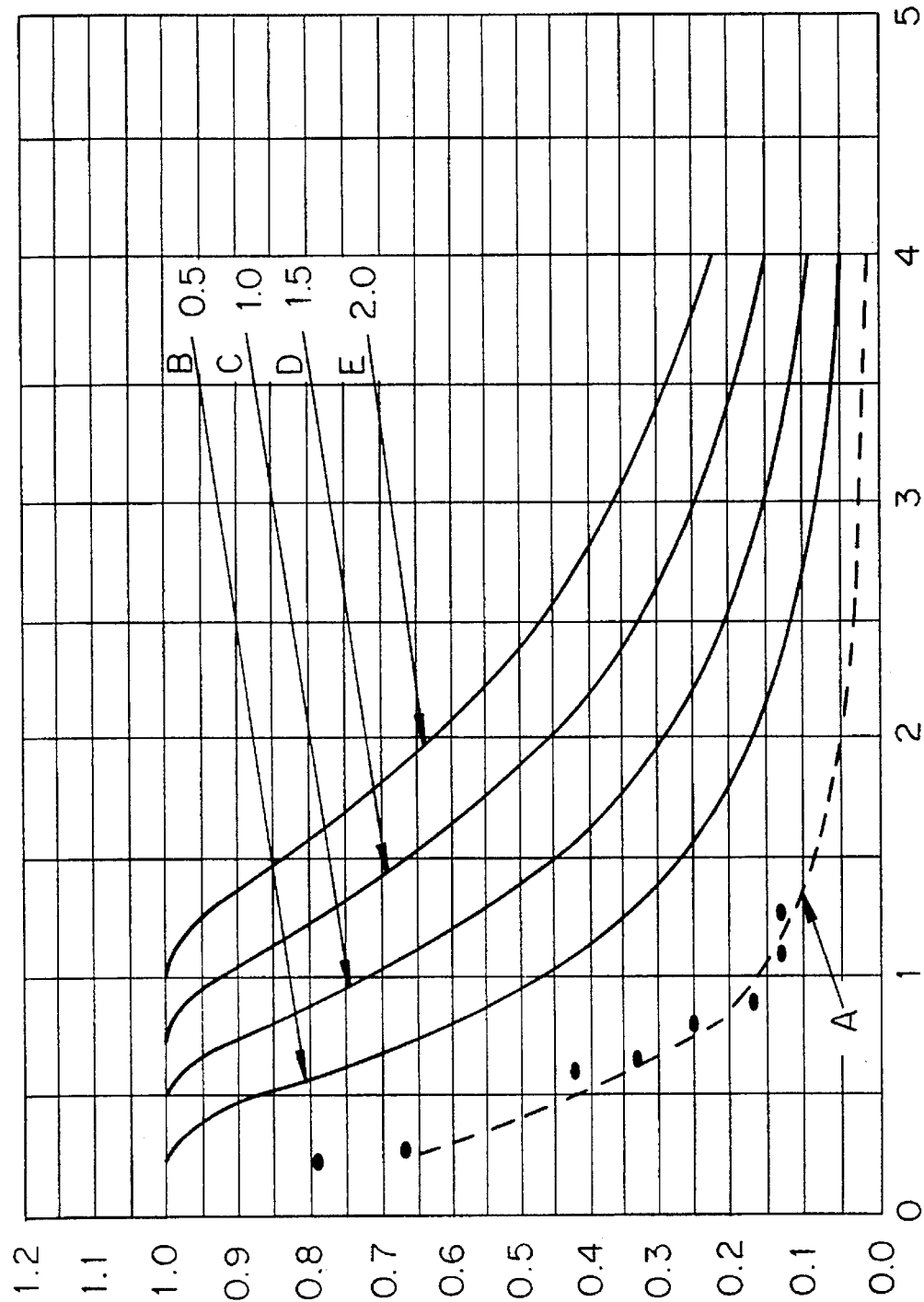
FIG. 17 is a diagram showing plots of bottom coverage versus aspect ratio of the contact hole for different collimator aspect ratios.

A specific example of the formation of first titanium layer 5, titanium nitride layer 6, and second titanium layer 13 is shown in the diagram depicted in FIG. 8 for a contact hole having an aspect ratio of 3, in which the diameter and depth of contact hole 4 are 0.5 μm and 1.5 μm, respectively, titanium layer 5 has a thickness of about 200 Å, titanium nitride layer 5 has a thickness of about 500 Å, and second titanium layer 13 has a thickness of about 200 Å formed on the surface, or a flat portion, of interlayer insulation layer 3 employing a collimation sputtering apparatus as shown in FIG. 16 (notably, without a shutter 109) in which the aspect ratio of the collimator 105 is 1.5 (diameter and height of the hole are 2 cm and 3 cm, respectively).

As shown in FIG. 16, a wafer 102, comprising semiconductor devices completed up to the state shown in FIG. 4, is mounted on the surface of a heat stage 101 and secured with a wafer clamp 103. Wafer 102 is heated by heat stage 101 and the inside of apparatus body 100 is evacuated. At this point, step S1 in FIG. 8 starts by introducing argon gas into the apparatus body 100 to provide an argon gas atmosphere. At step S2 in FIG. 8, power is supplied to a titanium target 104.

It is noted that it takes about 15 seconds from the initial introduction of argon gas until the flow rate of the argon gas to the inside of the apparatus body 100 becomes stable, and that the introduction of argon gas continues during a portion of step S2 in which the titanium layer 5 is being formed where power is supplied to titanium target 104.

During step S2, the titanium target 104 discharges sputtering particles of titanium which impinge on wafer 102, after a large amount of oblique components of the discharged titanium particles are removed by collimator 105, thereby forming first titanium layer 5 on the top surface of interlayer insulation layer 3, on contact region 2a of impurity diffusion region 2 at which contact hole 4 in interlayer insulation layer 3 is located, and on the exposed surfaces of interlayer insulation layer 3 in contact hole 4. A titanium layer 5 having a thickness of about 200 Å is formed on the surface, or the flat portion, of interlayer insulation layer 3, and having a thickness of about 30 Å is formed on contact region 2a of impurity diffusion region 2 at which contact hole 4 in interlayer insulation layer 3 is located, (with a bottom coverage of about 15%) in about 30 seconds.

At the next step S3 shown in FIG. 8, the power to the titanium target 104 is turned off, and nitrogen gas is simultaneously introduced into the apparatus body 100 with argon gas to provide the inside of the apparatus body 100 with a gas mixture of the argon gas and nitrogen gas. At step S4, the titanium target 104 is turned on.

It is noted that it takes about 15 seconds from the initial introduction of nitrogen gas until the flow rate of nitrogen gas to the inside of the apparatus body 100 becomes stable, and that argon and nitrogen gases continue to be introduced while titanium layer 6 is being formed in step S4 when power is supplied to titanium target 104.

At step S4, the titanium target 104 discharges sputtering titanium particles which are converted to sputtering titanium nitride particles by reaction with nitrogen in the nitriding atmosphere of nitrogen and argon gases. The sputtering titanium nitride particles impinge on wafer 102, after a large amount of oblique components are removed by the collimator 105, thereby forming titanium nitride layer 6 on the entire surface of first titanium layer 5. Titanium nitride layer 6 having a thickness of about 500 Å is formed on the surface, or a flat portion, of interlayer insulation layer 3, and having a thickness of about 75 Å is formed on contact region 2a of impurity diffusion region 2 at which contact hole 4 in interlayer insulation layer 3 is located (with a bottom coverage of about 15%) in about 75 seconds.

At step S5 as shown in FIG. 8, the power continues to be supplied to titanium target 104 as in step S4, and the introduction of nitrogen gas is stopped. Thus, during step S5, titanium target 104 discharges sputtering titanium particles which impinge on wafer 102, and form a second titanium layer 13 on the entire surface of the titanium nitride layer 6, after a large amount of oblique components are removed by collimator 105, as shown in FIG. 5. A second titanium layer 13 having a thickness of about 200 Å is formed on the surface, or a flat portion, of interlayer insulation layer 3, and having a thickness of about 30 Å is formed on contact region 2a of impurity diffusion region 2 at which contact hole 4 in the interlayer insulation layer 3 is located (with a bottom coverage of about 15%) in about 30 seconds.

During the formation of second titanium layer 13, sputtering titanium particles from titanium target 104 attach to collimator 105. The attached titanium functions as an adhesive, thereby preventing subsequent titanium nitride attached to the collimator 105 from peeling off and covering titanium nitride already attached to the collimator 105. A formation period of about 30 seconds for the second titanium layer 13 was sufficient for the titanium to function as an adhesive and to cover the titanium nitride.

At step S6 as shown in FIG. 8, power to titanium target 104 is turned off and the introduction of argon gas is stopped, which requires about 10 seconds. Thus, the series of steps for forming first titanium layer 5, titanium nitride layer 6, and second titanium layer 13 is concluded.

Figure 6:
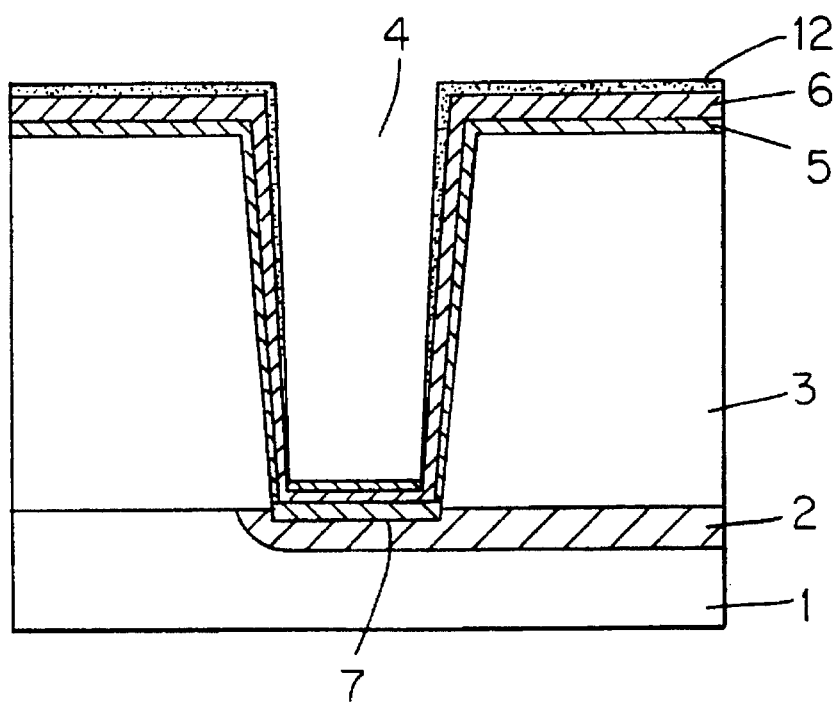

Wafer 102, on which first titanium layer 5, titanium nitride layer 6, and second titanium layer 13 are formed, is then conveyed under vacuum to a thermal chamber (not shown) of the collimation sputtering apparatus and, as shown in FIG. 6, heat-treated at about 600° C. to about 800° C., for example, 650° C., for about 30 seconds in a nitriding atmosphere, such as nitrogen or ammonia gas, thereby converting the contact portion of the titanium layer 5 contacting contact region 2a of semiconductor substrate 1 into titanium silicide layer 7, and converting second titanium layer 13 into thermal titanium nitride layer 12. In the described example, thermal treatment was conducted in a thermal chamber of the collimation sputtering apparatus; however, it should be apparent that such thermal treatment can be conducted in any conventional thermal treatment device, such as a thermal treatment device separated from the collimation sputtering apparatus, in which thermal treatment is conducted in nitriding atmosphere, such as nitrogen or ammonia atmosphere, at, for example, about 750° C. for about 30 seconds.

The titanium silicide layer 57 formed during thermal treatment comprises the entire titanium layer silicified which is located at the contact portion of first titanium layer 5 to contact region 2a, and encroaches to a small extent into impurity diffusion region 2. The thermal titanium nitride layer 12 formed during thermal treatment comprises the entire second titanium layer 13.

Thus, a multilayer composite is formed comprising: (a) a trilayer barrier layer structure comprising titanium silicide layer 7 formed on and in contact with contact region 2a, titanium nitride layer 6 and thermal titanium nitride layer 12; and (b) an insulation contacting portion comprising first titanium layer 5 on the top surface of the interlayer insulation layer 3 and on the exposed surfaces of the interlayer insulation layer 3 in contact hole 4 above the barrier layer, first titanium nitride layer 6 and second thermal titanium nitride layer 12.

Figure 7:
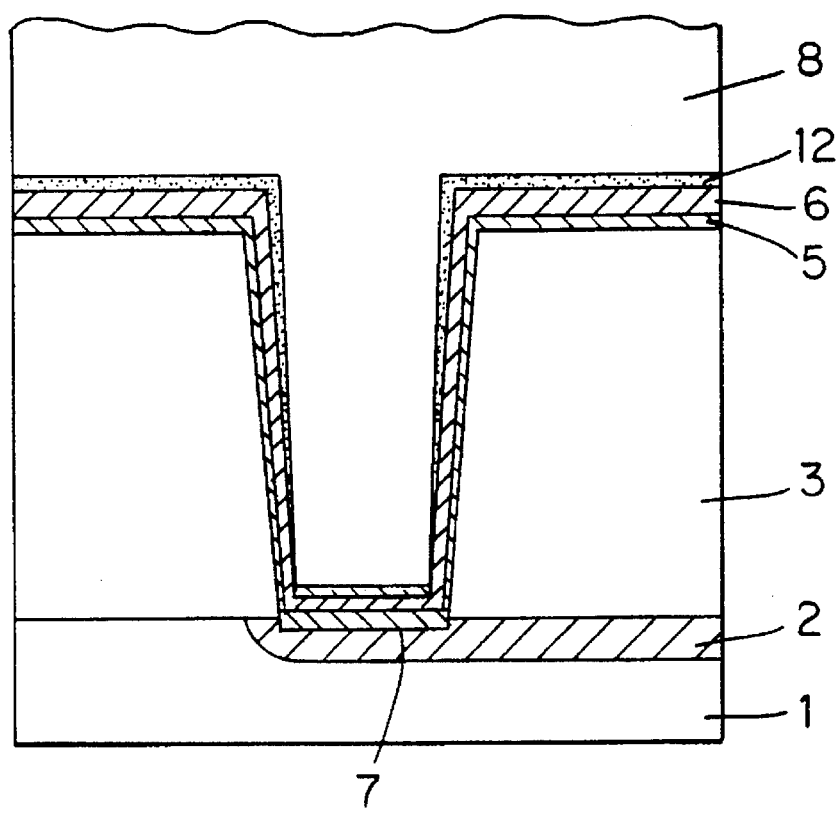

As shown in FIG. 7, a tungsten layer 8 is formed by a blanket chemical vapor deposition (CVD) method by depositing tungsten hexafluoride ($WF_6$) gas on the entire surface of semiconductor substrate 1, i.e., thermal titanium nitride layer 12. The blanked tungsten layer 8 is etched leaving tungsten layer 8 only in contact region 2a, thereby forming tungsten plug 9. As shown in FIG. 1, an aluminum layer is then formed on the entire surface of semiconductor substrate 1, i.e., on the entire surface of the exposed thermal titanium nitride layer 12 and the surface of tungsten plug 9. The aluminum layer is etched employing conventional photolithographic techniques, thereby forming interconnecting portion 10. The first titanium layer 5, titanium nitride layer 6, and thermal titanium nitride layer 12, lying below the aluminum layer, are also etched out at that time and removed, except for a portion or portions located below interconnection portion 10. Thus, an interconnection layer is formed comprising interconnecting portion 10 and tungsten plug 9. In this manner, impurity diffusion region 2 formed at the surface of semiconductor substrate 1 is electrically connected to the interconnection layer comprising interconnecting portion 10 and tungsten plug 9 through barrier metal layer 33 composed of the titanium silicide layer 7, titanium nitride layer 6, and thermal titanium nitride layer 12.

In the semiconductor device manufactured as described, thus the titanium silicide layer 7 reduces a natural oxide film existing on contact region 2a during heat-treatment of first titanium layer 5, because titanium is active, and enables the formation of a low resistance electrical connection between impurity diffusion region 2 and the interconnection layer by reaction with silicon in the impurity diffusion region 2. For example, a low resistance electrical connection can be formed with a first titanium layer 5 having a thickness of about 200 Å formed on the surface, or a flat portion, of interlayer insulation layer 3, and a thickness of about 30 Å formed on contact region 2a of impurity diffusion region 2 at which contact hole 4 in interlayer insulation layer 3 is located, as shown in FIG. 6, a titanium silicide layer 7 having a thickness of about 75 Å is formed by thermal treatment and located on contact region 2a, which is about 2.5 times the thickness of first titanium layer 5.

Figure 14:
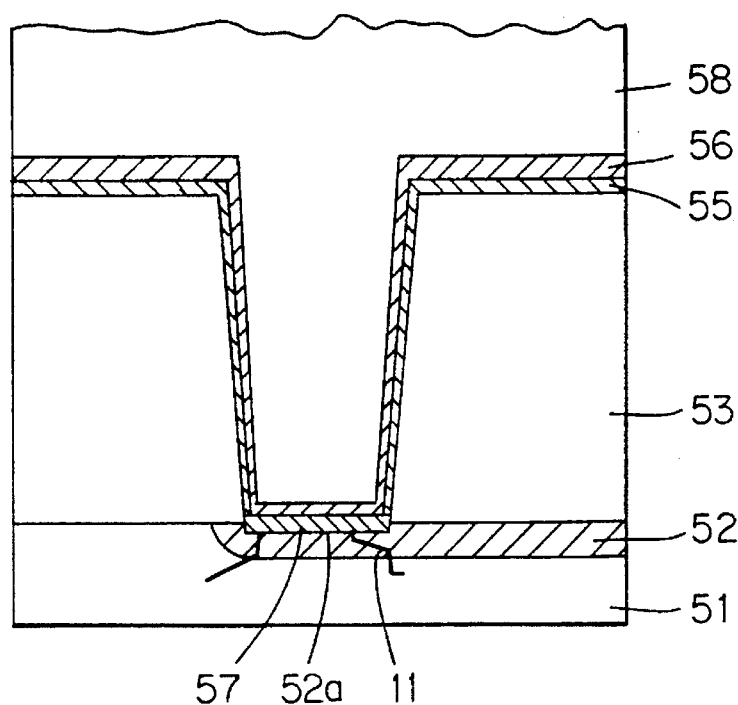
Figure 15:
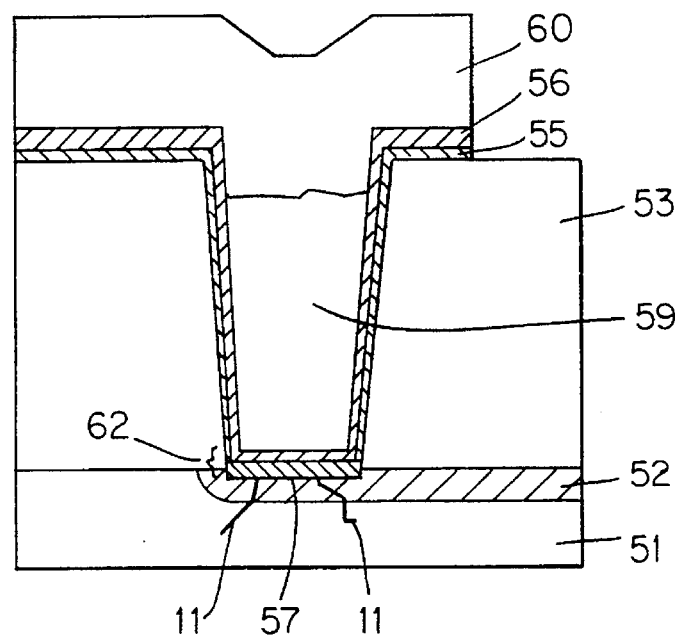

When a tungsten plug 9 of an interconnection layer is formed, peeling may occur if tungsten layer 8 is formed directly on the first titanium layer 5. In addition, the formation of tungsten layer 8 may be difficult when employing $WF_6$ as a source gas. These problems are overcome in the present invention, since titanium nitride layer 6 and thermal titanium nitride layer 12 function as adhesive layers between first titanium layer 5 and tungsten layer 8. Titanium nitride layer 6 and thermal titanium nitride layer 12 also function to prevent warm holes 11, as described in FIG. 14, from growing at impurity diffusion region 2 when tungsten layer 8 is formed by blanket CVD using $WF_6$ gas.

In forming titanium nitride layer 6 by reactive sputtering, a larger amount of scattering of sputtering particles by the atmosphere gas occurs, because titanium nitride layer 6 is formed by sputtering in a nitriding atmosphere having a pressure as low as about 4 mTorr, thereby resulting in more oblique components. In contrast, since thermal titanium nitride layer 12 is formed by thermal treatment of second titanium layer 13, the second titanium layer 13 can be formed by sputtering in an argon gas atmosphere of about 1 mTorr, with very little scattering of oblique components by the atmosphere gas, thereby resulting in improved bottom coverage. The thermal titanium nitride layer 12 is different from the titanium nitride layer 6, in that thermal titanium nitride layer 12 is formed by reactive sputtering and is, therefore, made of particulate grains as shown in FIG. 3. However, titanium nitride layer 6 is made of columnar grains as shown in FIG. 7. Therefore, when tungsten layer 8 is formed by blanket CVD employing $WF_6$ gas, encroachment of $WF_6$ gas is essentially prevented and, consequently, warm holes are prevented from growing at impurity diffusion region 2 against titanium nitride layer 6 formed by the reactive sputtering.

In a preferred embodiment of the present invention, the second titanium layer 6 has a thickness of about 500 Å on the surface, or a flat portion, of interlayer insulation layer 3, and a thickness of about 75 Å on contact region 2a of impurity diffusion region 2 at which contact hole 4 in interlayer insulation layer 3 is located. The thermal titanium nitride layer 12, derived from the second titanium layer 13 by thermal treatment, has a thickness of about 200 Å on the surface, or a flat portion, of interlayer insulation layer 3, and a thickness of about 30 Å on contact region 2a of impurity diffusion region 2 at which contact hole 4 in interlayer insulation layer 3 is located. Therefore, the total thickness of titanium nitride layer 6 and thermal titanium nitride layer 12 is about 105 Å on contact region 2a of impurity diffusion region 2 at which contact hole 4 in interlayer insulation layer 3 is located, so that warm holes are substantially prevented.

About 650 sheets of wafers 102 were processed by forming first titanium layer 5, titanium nitride layer 6, and second titanium layer 13 by the method shown in FIG. 8 using the apparatus shown in FIG. 16, and further processed to arrive at the state shown in FIG. 1. Titanium silicide layer 7, formed by thermal treatment, had a thickness of about 75 Å and was effective to form a low resistance electrical connection between impurity diffusion region 2 and the interconnection layer. The titanium nitride layer 6 and thermal titanium nitride layer 12 prevented films from peeling off when the tungsten plug 9 of the interconnection layer was formed, and functioned as an adhesive layer between first titanium layer 5 and tungsten layer 8. The combined thickness of titanium layer 6 and thermal titanium nitride layer 12 was 105 Å on contact region 2a of impurity diffusion region 2 at which contact hole 4 in interlayer insulation layer 3 is located, and prevented warm holes from growing of impurity diffusion region 2 when tungsten layer 8 is formed by blanket CVD employing $WF_6$ gas.

Figure 18:
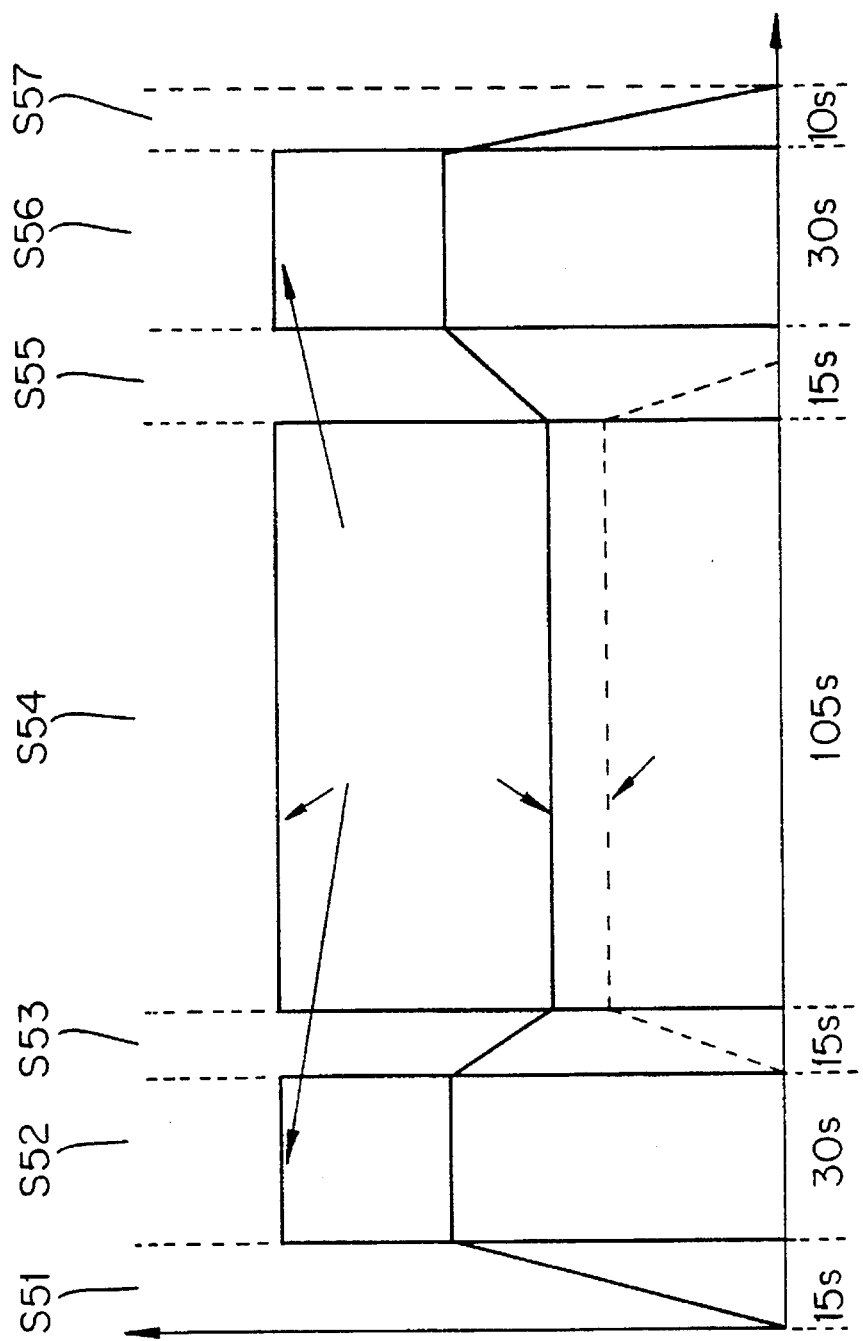
FIG. 18 is a manufacturing flow diagram for manufacturing a barrier metal layer composed of a bilayer structure of a titanium layer including titanium silicide and of a titanium nitride layer.

The "trilayer barrier layer" 33 of the present invention comprising titanium silicide layer 7, titanium nitride layer 6, and thermal titanium nitride layer 12 by the thermal treatment formed by the method shown in FIG. 8. The trilayer barrier layer offers several advantages over the conventional "bilayer barrier layer" 62, comprising titanium silicide layer 7 and titanium nitride layer 6, formed by the method shown in FIG. 18. Firstly, the processing time for a single wafer 102 formed with the trilayer barrier layer is shortened 20% in comparison with that formed with the bilayer barrier layer, thereby improving processing capacity of the collimation sputtering apparatus. As apparent from FIG. 18, 220 seconds are consumed in processing a sheet of wafer 102 forming the bilayer barrier layer; whereas, as apparent from FIG. 8, only 175 seconds are consumed in processing a sheet of wafer 102 forming the trilayer barrier layer of the present invention, thereby realizing a savings of 45 seconds.

Secondly, the amount of titanium target 104 consumed for the trilayer barrier layer can be reduced 18% with respect to that for the bilayer barrier layer. As apparent from FIG. 18, power is supplied to titanium target 104 for 165 seconds during processing a sheet of wafer 102 in forming the bilayer barrier layer; whereas, as apparent from FIG. 8, the power is supplied to titanium target 104 for only 135 seconds in processing a sheet of wafer 102 when forming the trilayer barrier layer of the present invention, thereby reducing by 30 seconds the time that power is supplied to titanium target 104 and, the consequently, reducing amount of titanium target 104 consumed.

Thirdly, since the amount of titanium target 104 for the trilayer barrier layer consumed can be reduced 18% as compared to that for the bilayer barrier layer, the amount of titanium nitride and the like attaching to collimator 105 when a single wafer is to be processed for the trilayer barrier layer will also be reduced as compared to the bilayer barrier layer, thereby increasing the number of sheets of wafers 102 to be processed by 22% before replacing collimator 105.

Fourthly, in forming the trilayer barrier layer of the present invention, the occurrence of particles can be reduced in comparison with forming the bilayer barrier layer. In forming the bilayer barrier layer, the ratio of titanium sputtering for forming first titanium layer 5 and for the cleaning period versus titanium sputtering for forming titanium nitride layer 6 is 0.57 (400 Å/700 Å). In contrast, forming the trilayer barrier layer of the present invention, the ratio of titanium sputtering for forming first and second titanium layers 5, 13, versus titanium sputtering for forming titanium nitride layer 6 is larger 0.80 (400 Å/500 Å). As a result, in forming the trilayer barrier layer of the present invention, the sputtering ratio of titanium functioning as an adhesive for preventing the titanium nitride attached to the collimator 105 from peeling off, is increased, thereby reducing peeling and preventing the occurrence of particles.

As shown in the above-described embodiment of the present invention, a low resistance electrical connection between impurity diffusion region 2 and the interconnection layer is obtained, warm holes prevented from growing in impurity diffusion region 2, and the processing capacity of a collimation sputtering apparatus improved, including replacement periods for collimator 105, reductions in the amount of titanium target 104 consumed, reduced particle formation and reduced costs.

Using the above-described embodiment, with a contact hole 4 having an aspect ratio of 3, in which the diameter and depth of contact hole 4 in interlayer insulation layer 3 are 0.5 μm and 1.5 μm, respectively, semiconductor devices were manufactured wherein first titanium layer 5, titanium nitride layer 6, and second titanium layer 13 were formed in various film thicknesses using a collimation sputtering apparatus (without a shutter 109) as in FIG. 16, wherein the aspect ratio of collimator 105 was 1.5 (diameter and height of the hole are 2 cm and 3 cm, respectively), employing the sequence shown in FIG. 8. The first titanium layer 5 is preferably sufficient to achieve a titanium silicide layer with a thickness of about 50 to about 200 Å on contact region 2a, and a titanium layer 5 having a thickness of about 150 to about 500 Å on the surface of interlayer insulation layer 3 (with a bottom coverage of about 15%). If the thickness of titanium silicide layer 7 is less than about 50 Å the resistance of the electrical connection between impurity diffusion region 2 and the interconnection layer undesirably increases. If the thickness of titanium silicide layer 7 exceeds 200 Å, the reaction between titanium and impurity diffusion region 2 is excessive and titanium silicide layer 7 might extend beyond the depth of impurity diffusion region 2, thereby resulting in junction leakage.

The thickness of each of titanium nitride layer 6 and thermal titanium nitride layer 12 is preferably about 100 Å on the surface of interlayer insulation layer 3. The titanium nitride layer 6 and thermal titanium nitride layer 12 preferably have a combined thickness of about 60 to about 300 Å on contact region 2a, and of about 400 to about 1,000 Å on the surface of interlayer insulation layer 3 (with a bottom coverage of about 15%). If the total thickness of titanium nitride layer 6 and thermal titanium nitride layer 12 on contact region 2a is less than about 60 Å, the prevention of warm holes caused by tungsten in the buried portion 9 of the interconnection layer is reduced; if the total thickness of titanium nitride layer 6 and thermal titanium nitride layer 12 exceeds about 300 Å, the processing capacity and efficiency of the collimation sputtering apparatus is impaired.

Various features of the above-described embodiment of the present invention are not confined to the mentioned features. For example, the buried portion 9 and the interconnecting portion 10 of the interconnection layer can be formed by film forming methods other than CVD, including any conventional deposition technique, such as PVD. In addition, the first conductor and the second conductor are not limited to a semiconductor substrate 1 and interconnection layer, respectively. The first conductor could be, but is manifestly not limited to, a lower layer polysilicon interconnection layer, while the second conductor could be an upper layer interconnection layer having the same feature as the second conductor in the first embodiment, formed over the lower layer interconnection layer through an interlayer insulation layer. Moreover, the first titanium layer 5 need not be entirely converted to titanium silicide layer 7. The first titanium layer 5 can be partially converted to titanium silicide layer 7, with a portion of first titanium layer 5 remaining.

Figure 9:
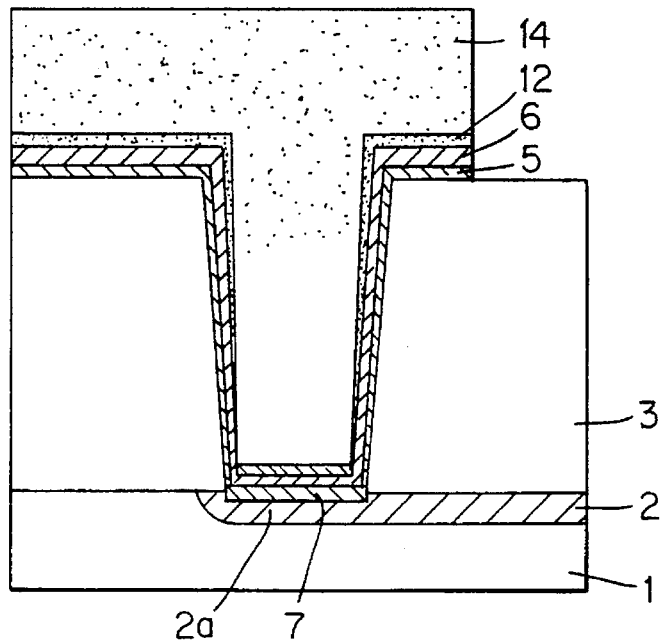
FIG. 9 is a cross-sectional view showing another embodiment of the invention.

Another embodiment of the present invention is shown in FIG. 9, wherein an interconnection layer constituting a second conductor is formed solely of a single conductive material, such as tungsten; whereas, in the previous embodiment, the interconnection layer constituting the second conductor comprises interconnecting portion 10, e.g., aluminum or an aluminum alloy, and buried portion 9, e.g., tungsten. The embodiment shown in FIG. 9 is otherwise the same as the embodiment of FIG. 1 and, therefore, the same reference numbers used in FIG. 1 are used in FIG. 9 to indicate the same or equivalent portions.

In manufacturing the semiconductor device according to the FIG. 9 embodiment, processing is conducted as in the FIG. 1 embodiment up to the stage shown in FIG. 7. In the FIG. 1 embodiment, the entire surface of tungsten layer 8, formed by blanket CVD using $WF_6$ gas, is etched back leaving only tungsten layer 8 in contact region 2a to form buried portion 9 composed of a tungsten plug. In the FIG. 9 embodiment of the present invention, interconnection layer 14 having a buried portion and an interconnecting portion is formed by etching tungsten layer 8, formed by blanket CVD using $WF_6$ gas, the depicted interconnection layer is formed employing conventional photolithographic and etching techniques. The first titanium layer 5, titanium nitride layer 6, and thermal titanium nitride layer 2, which are located below the tungsten layer, are etched except for a portion below interconnection layer 14 and removed. The resulting semiconductor device exhibits the same advantages as the FIG. 1 embodiment.

Although, in the FIG. 1 embodiment, interconnecting layer 14 of the second conductor is formed of tungsten, interconnecting layer 14 could be formed of, but not limited to, tungsten, copper (Cu), titanium nitride (TIN), aluminum (Al), titanium silicide (TiSi$_2$), tungsten silicide (WSi$_2$), or polysilicon, and a composite layer, such as a bilayer or trilayer structure, composed of layers selected from those materials. The barrier metal layer 33 comprising titanium silicide layer 7, titanium nitride layer 6, and thermal titanium nitride layer 12, prevents reaction between interconnecting layer 14 and silicon of semiconductor substrate 1, and provides the same advantageous effects as in the FIG. 1 embodiment.

EXAMPLE

Figure 10:
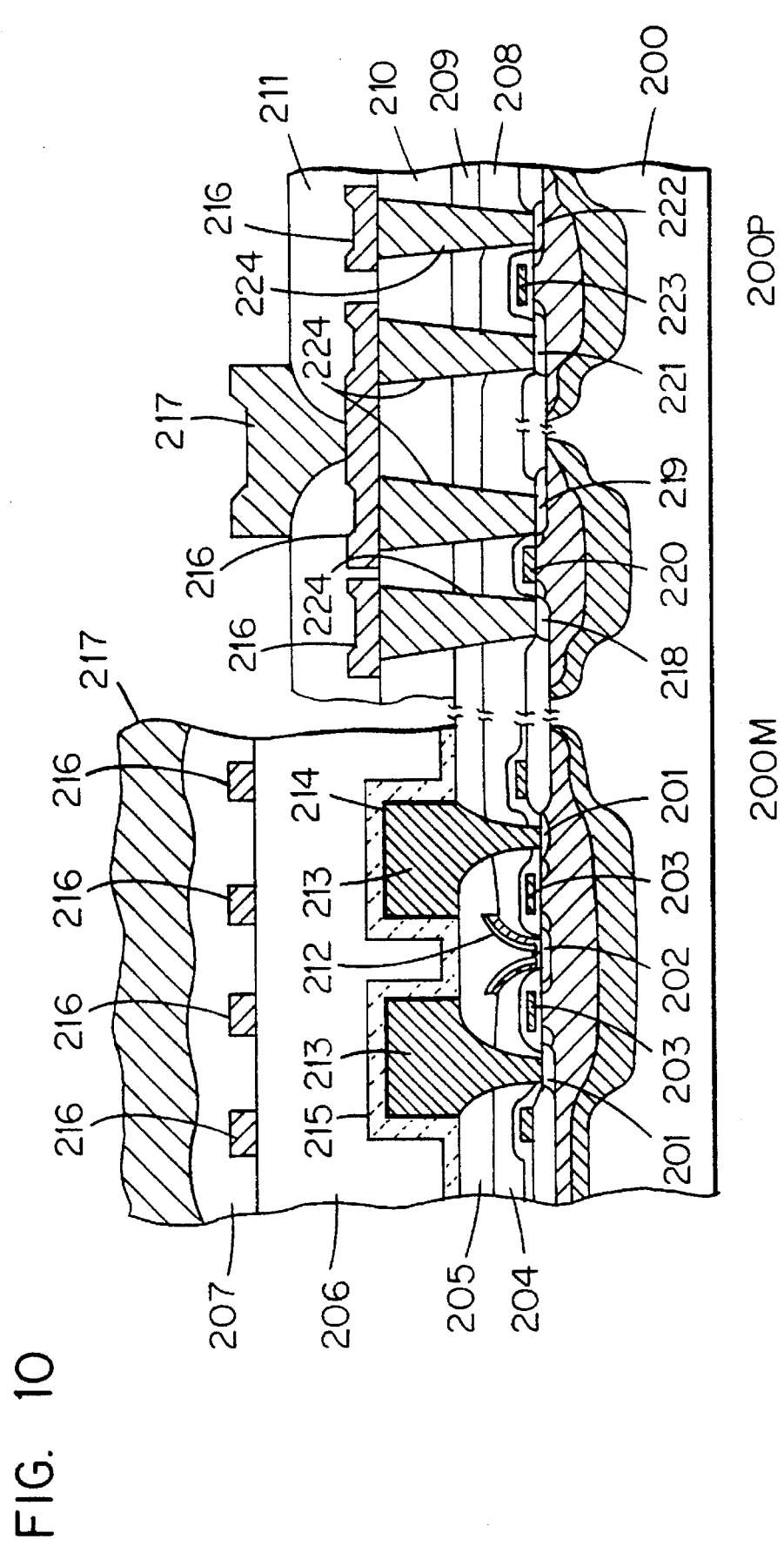
FIG. 10 is a cross-sectional view of a portion of a dynamic random access memory to which the invention relates.
Figure 11:
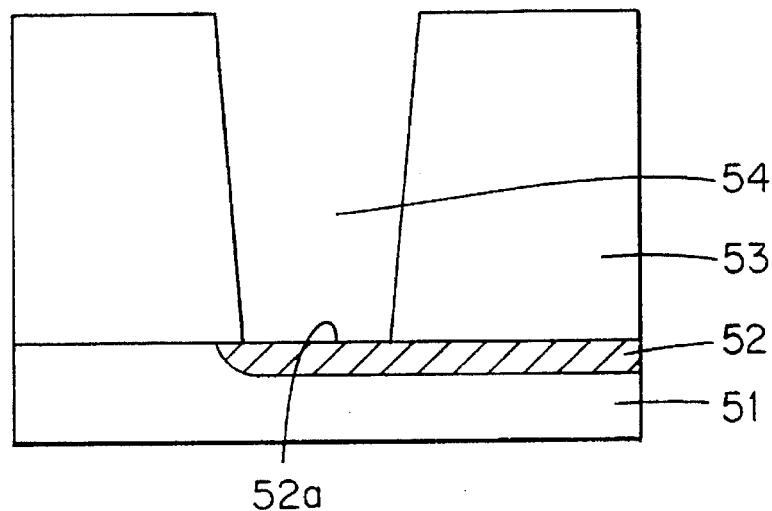
FIGS. 11 through 15 are cross-sectional views showing steps of prior manufacturing methods for producing a semiconductor device.
Figure 12:
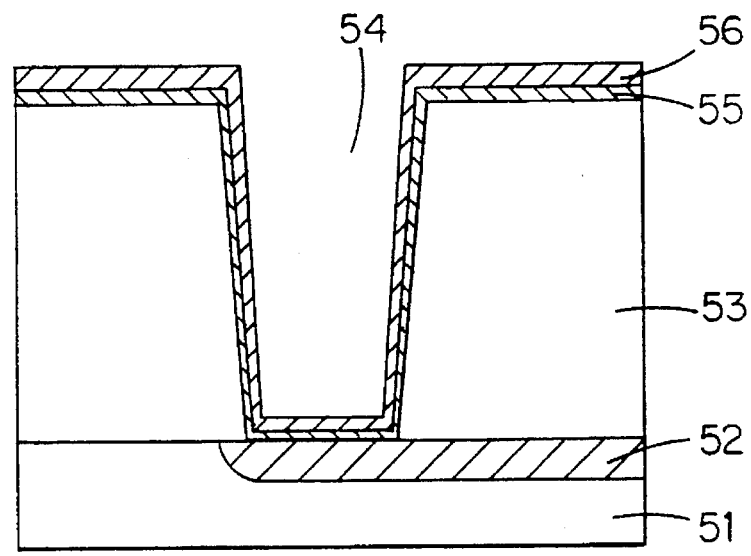
Figure 13:
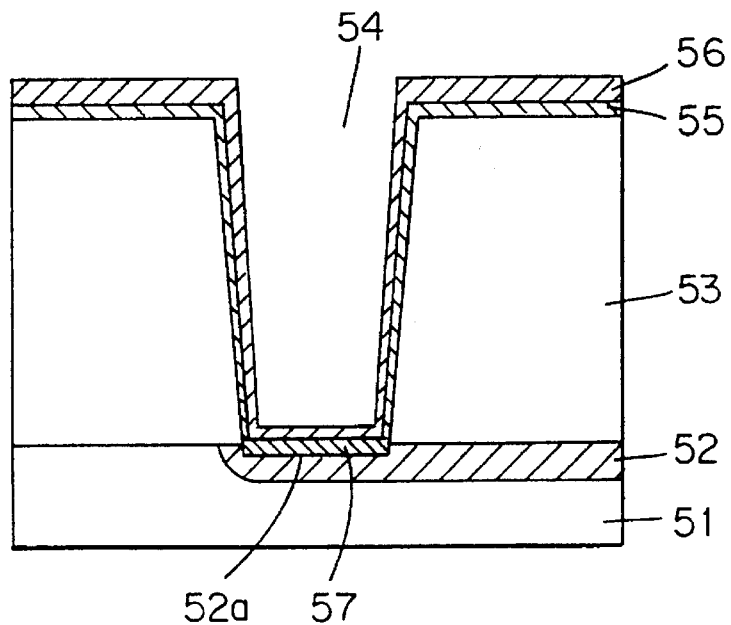

An example of the present invention is described with respect to FIG. 10, applying the FIG. 1 or FIG. 9 embodiment to a dynamic random access memory. FIG. 10 is a cross-sectional view showing a portion of a dynamic random access memory. For simplicity, the structure of the trilayer barrier layer of the present invention comprising titanium silicide layer 7, titanium nitride layer 6, and thermal titanium nitride layer 12, is not illustrated.

As shown in FIG. 10, a semiconductor substrate 200 is formed of silicon. A pair of source and drain regions 201, 202, consisting of n-type impurity-diffusion regions, constitute part of a transistor for a memory cell, with polysilicon gate electrode 203 formed on the surface of semiconductor substrate 200 between the pair of source and drain regions through a gate oxide. Gate electrode 203 comprises a part of the corresponding word line. Reference numerals 204 to 211 denote respective interlayer insulation layers. Bit line 212 is electrically connected to one of the source and drain regions 202 of the transistor of a memory cell through a contact hole in the interlayer insulation layer 204, and comprises a bilayer structure made of a lower layer of tungsten silicide and an upper layer of polysilicon.

A polysilicon storage node 213, forming one of the electrodes of a capacitor for a memory cell portion 200M, is formed at an upper layer of bit line 212, and is electrically connected to the other source and drain region 201 of the transistor for the memory cell portion 200M through a contact hole in interlayer insulation layers 204, 205. A polysilicon cell plate 215, constituting one of the electrodes of the capacitor for the memory cell portion 200M, is disposed opposite to the storage node through a dielectric film 214. A first layer 216, made of aluminum or an aluminum alloy, is formed above cell plate 215, and when placed in the memory cell portion 200M, is disposed opposite to, for example, a word line and thereby constitutes an interconnection layer electrically connected (or driven as piles) to the word line at plural points. Reference numeral 217 denotes a second aluminum layer formed above first aluminum layer 216, and when placed in the memory cell portion 200M, constitutes an interconnection layer electrically connected to, for example, a bit line.

A pair of source and drain regions 218, 219, formed at the surface of semiconductor substrate 200 are composed of n-type impurity diffusion regions of an n-channel transistor for peripheral circuit portion 200P. A polysilicon gate electrode 220, of the n-channel transistor for the peripheral circuit portion 200P is formed on the surface of the semiconductor substrate 200 between the pair of source and drain regions through a gate oxide layer and made of polysilicon. A pair of source and drain regions 221, 222, formed at the surface of semiconductor substrate 200, consist of p-type impurity diffusion regions and constitute a p-channel transistor for the peripheral circuit portion 200P with polysilicon gate electrode 223 formed on the surface of semiconductor substrate 200 between the pair of source and drain regions through a gate oxide layer.

A buried portion 224 of an interconnection layer, made of tungsten and buried in contact holes in the interlayer insulation layers 208, 209, 210, is formed at positions of the source and drain regions 218, 219, 221, 222 of the n-channel and p-channel transistors for the peripheral circuit portion 200P, constitutes an interconnection layer of the second conductor, with the first aluminum layer 216 serving as an interconnecting portion connected thereto.

The dynamic random access memory thus constituted, comprises a contact portion between the first and second conductors to which the trilayer barrier metal layer of the present invention comprising titanium silicide layer 7, titanium nitride layer 6, and thermal titanium nitride layer 12, as in the FIG. 1 or FIG. 9 embodiment, is applied as set forth below.

(1) A contact portion between one of the source and drain regions 202 of the transistor for the memory cell portion 200M and the bit line 212, where the first conductor is the semiconductor substrate 200 and the second conductor is the bit line 212.

(2) A contact portion between the other of the source and drain regions 201 of the transistor for the memory cell portion 200M and the storage node 213, where the first conductor is semiconductor substrate 200 and the second conductor is storage node 213.

(3) Contact portions between an interconnection layer and the source and drain regions 218, 219, 221, 222 of the p- or n-channel transistors for the peripheral circuit portion 200P, where the first conductor is semiconductor substrate 200 and the second conductor is the interconnection layer composed of the buried portions 224 and first aluminum layer 216 electrically connected to buried portions 224.

(4) A contact portion between the bit line 212 and second aluminum layer 217, where the first conductor is bit line 212 and the second conductor is second aluminum layer 217.

In the dynamic random access memory formed with bit line 212 placed below storage node 213 and with first aluminum layer 216 placed above cell plate 215, electrical connections between the interconnection layer having first aluminum layer 216 in the peripheral circuit portion 200P and the source and drain regions 218, 219, 221, 222 of the p- or n-channel transistors for the peripheral circuit portion 200P are effected through the contact holes in the interlayer insulation layers 208, 209, 210. Since those contact holes have deep depths and very high aspect ratios, significant advantages effects can be obtained employing the present invention.

Only the preferred embodiments of the invention and an example of the versatility are shown and described in the present disclosure. It is to be understood that the invention is capable of use in various other combinations and environments and is capable of changes or modifications within the scope of the inventive concept as expressed herein.

We claim:

1. A semiconductor device comprising:

a first conductor having a contact region on its surface;

an interlayer insulation layer formed on said first conductor with a contact hole having an aspect ratio of at least 2.5 located on said contact region of said first conductor;

a barrier layer comprising:
  a titanium silicide layer formed on said contact region of said first conductor located within said contact hole of said interlayer insulation layer;
  a titanium nitride layer formed on said titanium silicide layer by collimation sputtering; and
  a thermally nitrided titanium layer formed on said titanium nitride layer; and a second conductor formed on a surface of said interlayer insulation layer and electrically connected to said contact region of said first conductor through said barrier layer, said second conductor comprising a buried portion containing tungsten within said contact hole and electrically connected to said barrier layer.

2. A semiconductor device according to claim 1, wherein said first conductor is a semiconductor substrate comprising silicon, and the contact region of said first conductor is at least a part of an impurity diffusion region formed at the surface of said semiconductor substrate.

3. A semiconductor device according to claim 1, wherein said first conductor is an interconnection layer formed on a semiconductor substrate through an insulation layer.

4. A semiconductor device according to claim 1, wherein said second conductor further comprises an interconnecting portion formed on the surface of said interlayer insulation layer and electrically connected to the buried portion.

5. A semiconductor device according to claim 4, wherein said interconnecting portion comprises at least one from the group of aluminum and aluminum alloys.

6. A semiconductor device comprising:
a first conductor having a contact region on its surface;
an interlayer insulation layer comprising a top surface formed on said first conductor, sand interlayer insulation layer having a contact hole formed in and exposing surfaces of said interlayer insulation layer, said contact hole located on said contact region of said first conductor and having an aspect ratio of at least 2.5;
a multilayer composite formed on said contact region, on said top surface of said interlayer insulation layer, and on said exposed surfaces within said contact hole, said multilayer composite comprising:
(a) a barrier layer comprising:
  a titanium silicide layer having a thickness of about 50 to about 200 Å formed on and in contact with the contact region of said first conductor located within the contact hole;
  a first titanium nitride layer having columnar grains formed on said titanium silicide layer; and
  a second titanium nitride layer having particulate grains formed on said first titanium nitride layer; wherein said titanium silicide layer has a thickness of about 50 to about 200 Å, and the total thickness of said first and second titanium nitride layers is about 60 to about 300 Å; and
(b) an insulation contacting portion comprising:
  a titanium layer on said top surface of said interlayer insulation layer and on said exposed surfaces of said interlayer insulation layer in said contact hole above said barrier layer, said titanium layer having a thickness of about 150 to about 500 Å;
  a first titanium nitride layer having columnar grains formed on said titanium layer; and
  a second titanium nitride layer having particle grains formed on said first titanium nitride layer; wherein said first and second titanium nitride layers each has a thickness of at least about 100 Å and a total thickness of about 400 Å to about 100 Å; and a second conductor formed on said barrier layer and electrically connected to the contact region of said first conductor through said barrier layer, said second conductor comprising tungsten within said contact hole and electrically connected to said barrier layer.

7. A semiconductor device according to claim 6, wherein said first conductor is a semiconductor substrate comprising silicon, and the contact region of said first conductor is at least a part of an impurity diffusion region formed at the surface of said semiconductor substrate.

8. A semiconductor device according to claim 6, wherein said first conductor is an interconnection layer formed on a semiconductor substrate through an insulation layer.

9. A semiconductor device according to claim 6, wherein said second conductor further comprises an interconnecting portion formed on the surface of said interlayer insulation layer and electrically connected to the buried portion.

10. A semiconductor device according to claim 6, wherein said interconnection portion comprises at least one from the group of aluminum and aluminum alloys.

11. In a multilevel semiconductor device comprising a first conductor formed on a lower level separated by an interlayer insulating layer and a second conductor formed on an upper level, wherein the first conductor is electrically connected to the second conductor by an interconnection comprising tungsten within a through-hole of the interlayer insulating layer, and wherein the interconnection comprises a barrier layer and the through-hole has an aspect ratio of at least 2.5, the improvement wherein the barrier layer comprises: a titanium silicide layer formed on at least a portion of the first conductor; a first titanium nitride layer formed on said titanium silicide layer; and a thermally nitrided titanium layer formed on said first titanium nitride layer.

12. The semiconductor device according to claim 11, wherein said first titanium nitride layer contains columnar grains, and said thermally nitrided titanium layer contains particulate grains.

13. A semiconductor device comprising:
a first conductor having a contact region on its surface;
an interlayer insulation layer formed on said first conductor with a contact hole having an aspect ratio of at least 2.5 located on said contact region of said first conductor;

a barrier layer comprising:
  a titanium silicide layer formed by collimation sputtering on said contact region of said first conductor located within said contact hole of said interlayer insulation layer;
  a titanium nitride layer formed by collimation sputtering on said titanium silicide layer; and
  a thermally nitrided titanium layer formed on said titanium nitride layer; and a second conductor formed on a surface of said interlayer insulation layer and electrically connected to said contact region of said first conductor through said barrier layer, said second conductor comprising a buried portion containing tungsten formed by chemical vapor deposition within said contact hole and electrically connected to said barrier layer.

* * * * *